(12) United States Patent
Lee et al.

(10) Patent No.: US 6,374,361 B1
(45) Date of Patent: Apr. 16, 2002

(54) SKEW-INSENSITIVE LOW VOLTAGE DIFFERENTIAL RECEIVER

(75) Inventors: Kyeongho Lee; Deog-Kyoon Jeong, both of Seoul (KR)

(73) Assignee: Silicon Image, Inc., Sunnyvale, CA (US)

( * ) Notice: Subject to any disclaimer, the term of this patent is extended or adjusted under 35 U.S.C. 154(b) by 0 days.

(21) Appl. No.: 09/298,369

(22) Filed: Apr. 22, 1999

Related U.S. Application Data

(60) Provisional application No. 60/082,959, filed on Apr. 23, 1998.

(51) Int. Cl.[7] .................................................. G06F 1/04
(52) U.S. Cl. ........................................ 713/503; 713/600
(58) Field of Search ............................. 713/400, 401, 713/503, 600

(56) References Cited

U.S. PATENT DOCUMENTS

| | | | |
|---|---|---|---|
| 5,068,628 A | 11/1991 | Ghoshal | 331/1 |
| 5,574,756 A | 11/1996 | Jeong | 375/376 |
| 5,636,254 A | 6/1997 | Hase et al. | 375/371 |
| 5,712,884 A | 1/1998 | Jeong | 375/375 |
| 5,905,769 A | * 5/1999 | Lee et al. | 375/376 |
| 5,974,464 A | * 10/1999 | Shin et al. | 709/231 |
| 5,987,619 A | * 11/1999 | Hamamoto et al. | 713/401 |
| 6,166,572 A | * 12/2000 | Yamaoka | 327/149 |

FOREIGN PATENT DOCUMENTS

EP 0 614 281 A2 9/1994 ........... H03L/7/081

* cited by examiner

*Primary Examiner*—Dennis M. Butler
(74) *Attorney, Agent, or Firm*—Fenwick & West LLP

(57) ABSTRACT

An apparatus for correcting skew between data signals and a clock signal in a system where the data and clock signals are transmitted and using low-voltage differential swing is disclosed. The apparatus comprises, in one embodiment, a delay locked loop, for converting the LVDS clock signal into a full-swing clock signal and generating a plurality of clock recovery signals from the converted full-swing clock signal, and a plurality of data recovery signals from the converted full-swing clock signal, and a plurality of data recovery channels, each channel coupled to a data signal and comprising an LVDS converter, a skew adjust circuit, a sampler array, a phase adjusting circuit. The delay locked loop and the data channel circuitry combine to remove skew from LVDS signals by generating multiple clock signals, sampling the data at multiple intervals, using the samples to eliminate skew, and retrieving correct data samples from the data signals. In another embodiment, the sampler array comprises a plurality of transition sampling circuits, for sampling transitions between two adjacent serial bits of data and generating a lock signal and a sampled data signal responsive to the sampled transition, and a plurality of center sampling circuits, for sampling a center position of each serial bit of data and generating a center sample signal responsive to the sample, and the phase adjusting circuit generating skew control signals responsive to the center sample signals, lock signals, and transition data signals received from the sampler array.

27 Claims, 10 Drawing Sheets

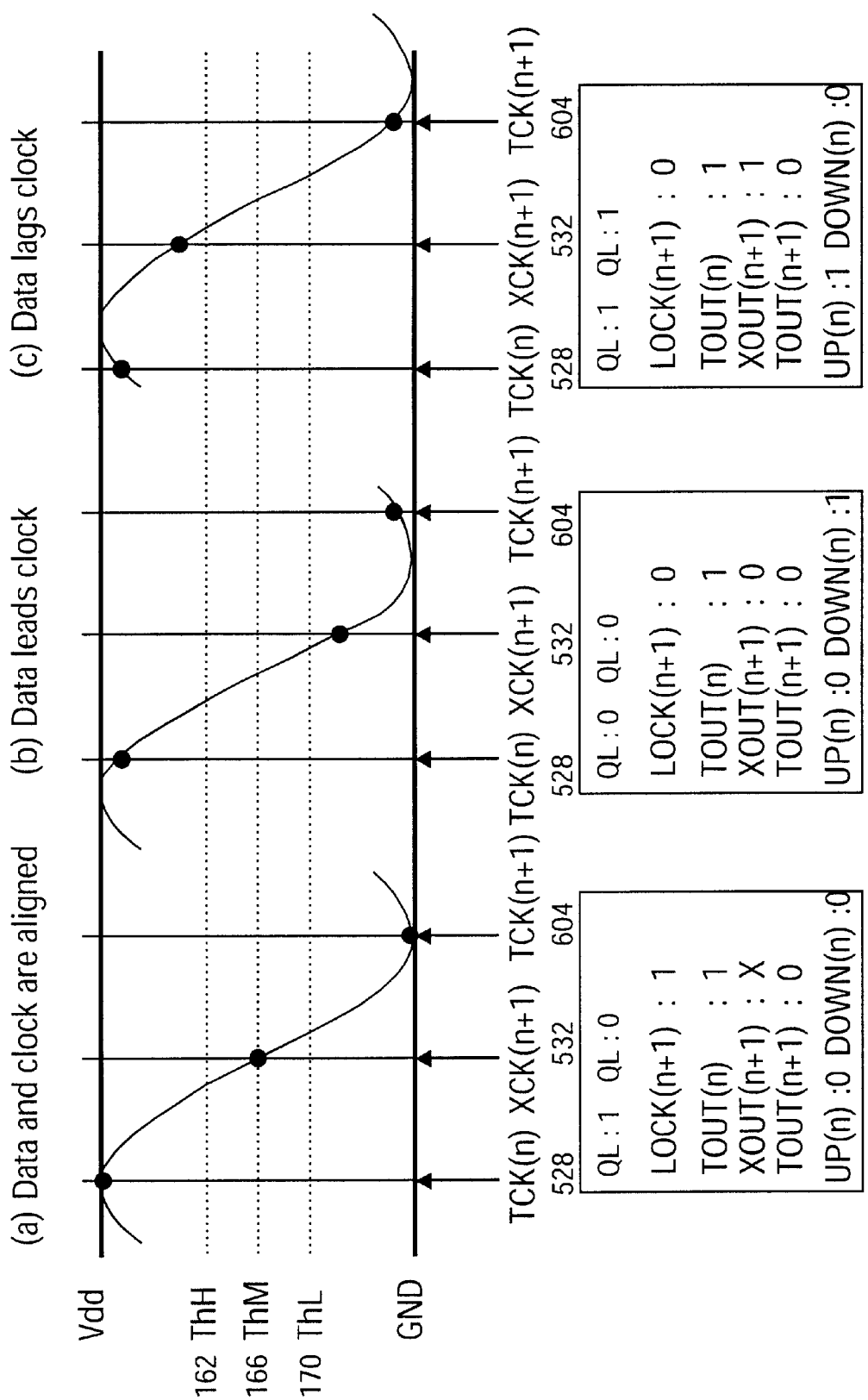

SKEW-INSENSITIVE LOW VOLTAGE DIFFERENTIAL RECEIVER

This application claims the benefit of U.S. Provisional application No. 60/082,959 filed Apr. 23, 1998.

BACKGROUND OF THE INVENTION

1. Technical Field

This invention relates to data communication systems. More particularly, this invention elates to LVDS data recovery in a receiving system of digital data transmitted via a high-speed ink.

2. Description of the Related Art

High-speed low voltage differential swing (LVDS) interfaces have become popular to use as display interfaces, especially for flat panel displays. By using an LVDS interface, the electromagnetic interference (EMI) level of computer systems may be sufficiently reduced to allow a computer system to pass current commercial EMI compliance limits. However, current commercial LVDS chip sets suffer from insufficient bandwidth; for example, many do not even have enough bandwidth to support XGA resolution, which is 455 Mbps (65 MHz×7).

The main limitation on the required bandwidth is caused by timing skew. Skew is primarily caused by cable and board line length mismatches. The situation is aggravated as the cable length and the required bandwidth increases. Unless skew is properly corrected or managed, the required bandwidth cannot be met. Therefore, a skew-managing scheme for LVDS interface is needed which can remove the timing skew between data and clock channels, and thereby increase the maximum bandwidth of the system and enhance compatibility among LVDS chip sets.

SUMMARY OF THE INVENTION

In accordance with the present invention, a skew-managing scheme for an LVDS system s disclosed to provide greater bandwidth for LVDS systems.

An apparatus for correcting skew between data signals and a clock signal in a system where the data and clock signals are transmitted using low-voltage differential swing is disclosed. The apparatus comprises, in one embodiment, a delay locked loop, for converting the LVDS clock signal into a full-swing clock signal, and a plurality of data recovery channels, each channel coupled to a data signal and comprising an LVDS converter, a skew adjust circuit, a sampler array, and a phase adjusting circuit. The delay locked loop and the data channel circuitry combine to remove skew from LVDS signals by generating multiple clock signals, sampling the data at multiple intervals, using the samples to eliminate skew, and retrieving correct data samples from the data signals.

In another embodiment, the sampler array comprises a plurality of transition sampling circuits, for sampling transitions between two adjacent serial bits of data and generating a lock signal and a sampled data signal responsive to the sampled transition, and a plurality of center sampling circuits, for sampling a center point of each serial bit of data and generating a center sample signal responsive to the sample, and the phase adjusting circuit for generating skew control signals responsive to the center sample signals, lock signals, and transition data signals received from the sampler array.

BRIEF DESCRIPTION OF THE DRAWINGS

FIGS. 6a–c timing diagrams illustrating the functionality of the phase adjusting circuit.

DESCRIPTION OF THE PREFERRED EMBODIMENT

Figure 1:
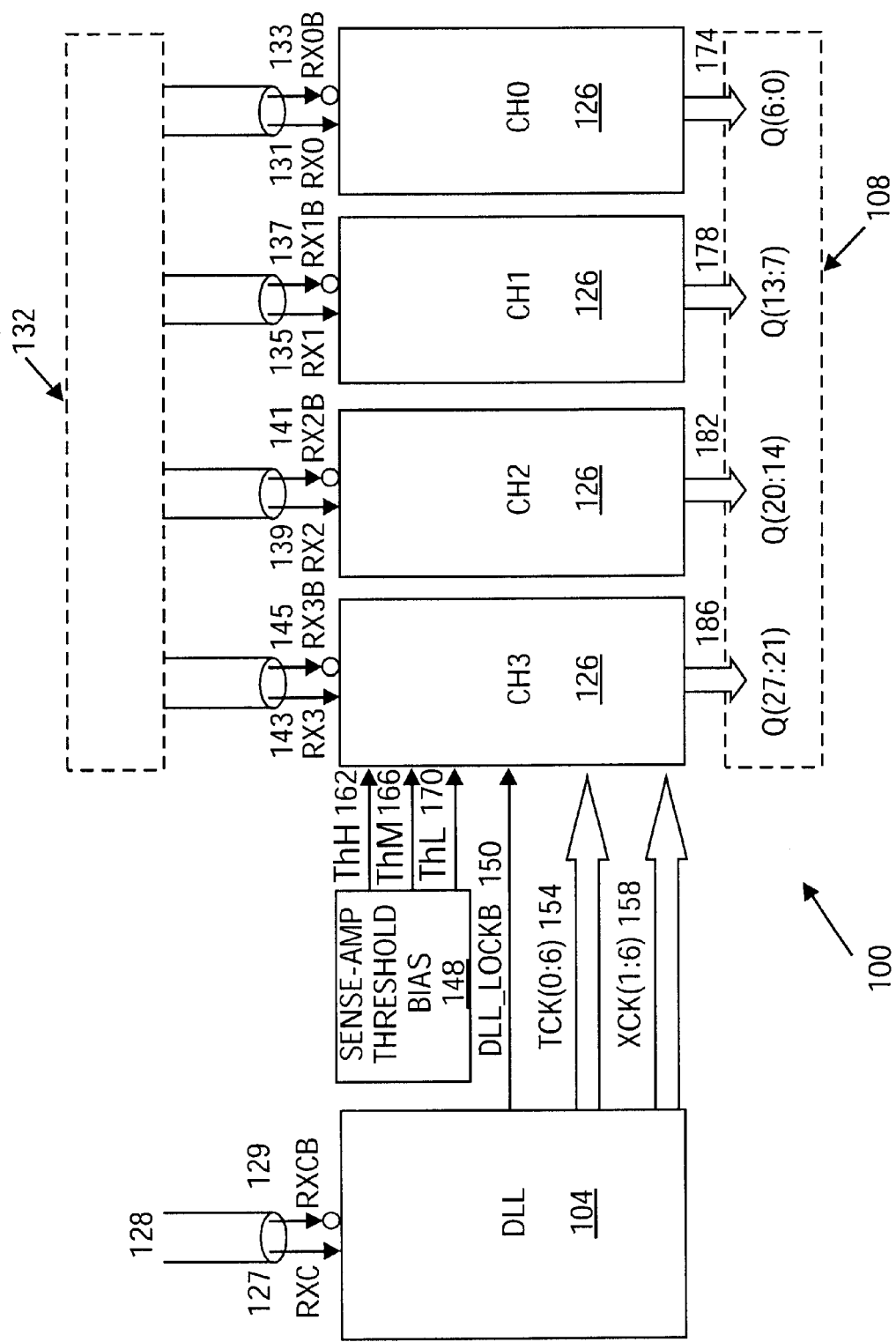
FIG. 1 illustrates a block diagram of the skew-insensitive Low Voltage Differential Swing (LVDS) receiver.

FIG. 1 illustrates the block diagram of the skew-insensitive Low Voltage Differential Swing (LVDS) receiver 100. The receiver 100 comprises a clock generating delay locked loop (DLL) 104, a threshold bias circuit 148, and four equivalent data recovery channels 126. The DLL 104 receives N MHz LVDS clock signals (RXC 127, RXCB 129) from the cable and generates two sets of 7-phase N MHz clock (TCK(0:6) 154, XCK(0:6) 158).

Each data recovery channel 126 receives 7×M Mbps LVDS serial data from the cable 132 and removes the skew between the clock 128 and the data 132 to recover 7-bit parallel data which is synchronized by the N MHz clock. For removing skew and accomplishing data recovery, each data recovery channel 126 uses the TCK(0:6) 154, and XCK(1:6) 158 generated by the DLL 104. The phase interval between two adjacent phase clock signals (TCK(n) to TCK(n+1), XCK(n) to XCK(n+1)) is equal to one bit time interval or a single data cycle. The phase interval between XCK(n) and TCK(n+1) is equal to a one-half bit time interval or a half-data cycle. In accordance with the skew-removing operation, described in greater detail below, transition clock signals XCK(1:6) 158 continuously sample the transition position between the two adjacent serial bits, and center clock signals TCK(0:6) 154 sample the exact center position of each serial bit. The 7-bit recovered data 108 is obtained by sampling the exact center positions of each serial bit using the rising edges of TCK(0:6) 154.

Figure 2:
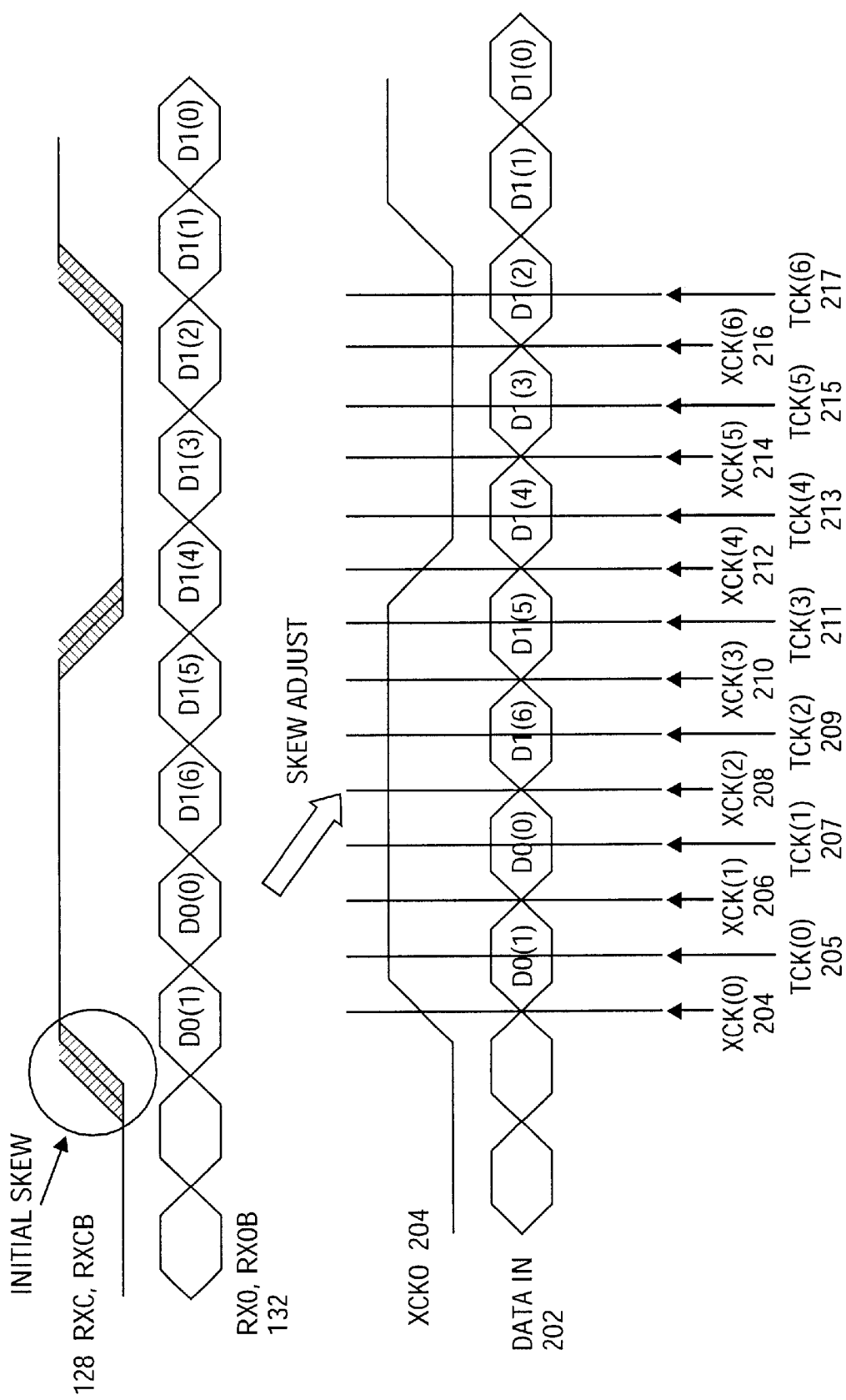
FIG. 2 illustrates timing diagrams of the skew removal operation of the receiver.

As can be seen in FIG. 2, the initial clock signals 128 are skewed with the initial data signals 132. Without correction, the clock signals 128 would cause the data 132 to be sampled to points other than the center point of each serial bit. This will lead to error, decreasing the maximum bandwidth. However, in accordance with the present invention, the skew between clock 128 and data 132 is corrected so that the maximum bandwidth can be maintained. The multiple sets of clock recovery signals TCK 154 and XCK 158 sample the bit streams at the transitions and the center points of the bits. The transition samples provides skew information. The center samples provide the output data 108.

Figure 3:
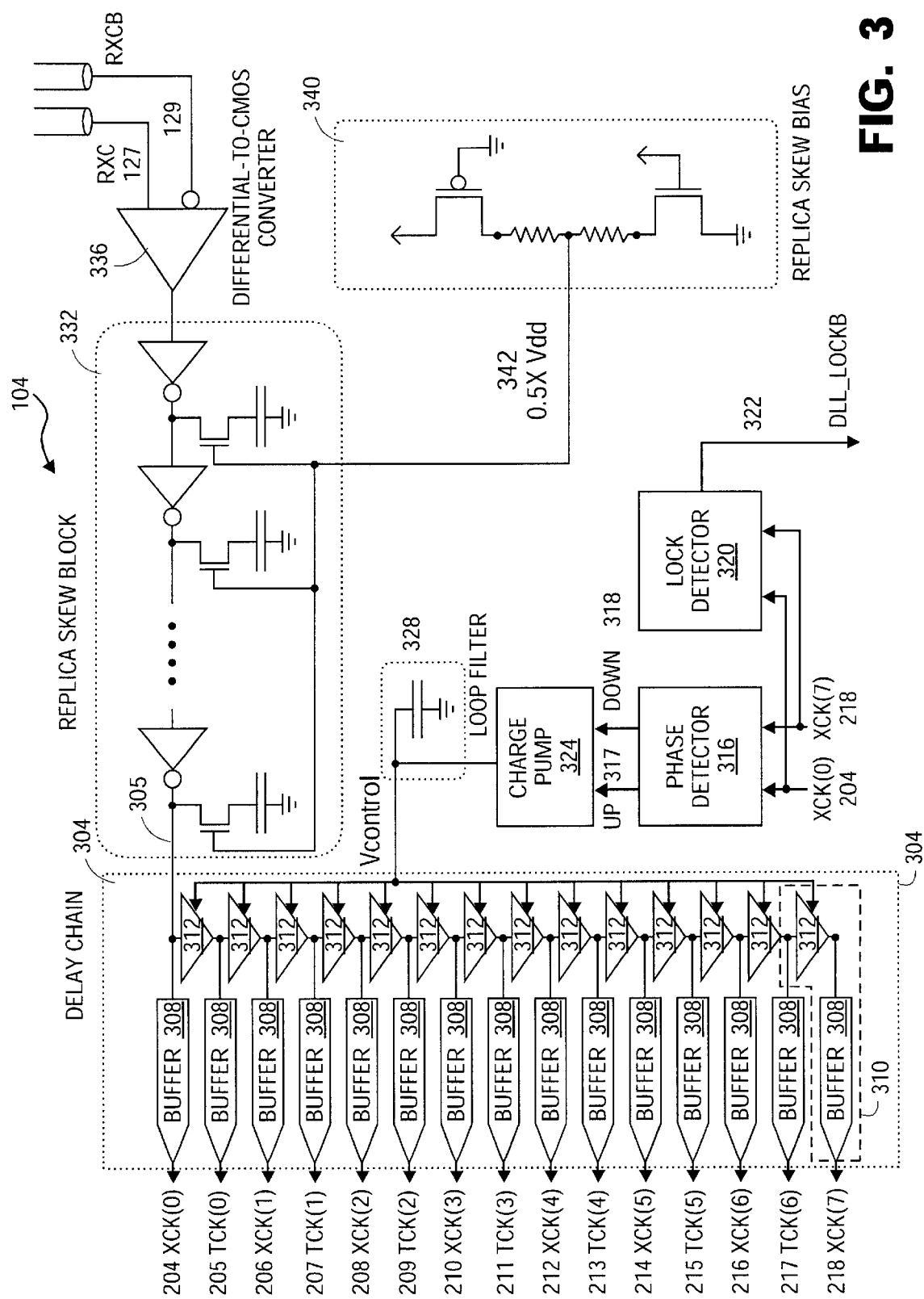
FIG. 3 is a more detailed block diagram of the delay locked loop.

FIG. 3 illustrates the detailed block diagram of the DLL 104. The finction of the DLL 104 is to generate multiple clock recovery signals 154, 158 and a lock signal 150, after synchronizing all of the generated clock recovery signals 154, 158. The DLL 104 comprises a differential-to-CMOS converter 336, a replica skew circuit 332, a replica skew bias circuit 340, a delay chain 304, a plurality of buffers 308, a phase detector 316, a charge pump 324, loop filter 328, and a lock detector 320. The differential-to-CMOS converter 336 receives the LVDS clock signal 127, 129 (having differential amplitude) from the cable and converts it into a full swing clock signal (compatible with CMOS device operation). The converted full swing clock signal is transmitted to the replica skew circuit 332, which creates the exact same delay as a skew adjust circuit 404 in the initial state of each data channel 126 described below. The replica skew bias circuit 340 continuously generates 0.5 Vdd, which determines the delay of the replica skew circuit 332. The replica skew circuit generates a reference delay, which provides a timing around which the actual skew is corrected. The output of the replica skew circuit 332, the delayed full-swing clock signal 305, is transmitted to the input of the delay chain 304.

The delay chain 304 comprises a plurality of delay devices 310. More specifically, the delay chain 304 comprises 14 delay devices 310. Each delay device 310 preferably comprises a delay cell 312 and a clock buffer 308; however, other methods of delaying a signal may also be used. XCK(0) is generated by passing the delayed full-swing clock signal 305 to the delay chain 304 through a clock buffer 308. The output of the 14th delay cell 312 generates XCK(7) 218 by passing the output of the 13th delay cell 312 through a clock buffer 308.

The phase detector 316 compares the rising edges of XCK(0) 204 and XCK(7) 218. When the rising edge of XCK(7) 218 lags the rising edge of XCK(0) 204, the phase detector 316 generates an UP signal 317. When the rising edge of XCK(7) 218 leads the rising edge of XCK(0) 204, the phase detector 316 generates a DOWN signal 318.

Responsive to receiving an UP signal 317, the charge pump circuit 324 provides current into the loop filter 328 to increase control voltage of the delay chain 304, and thus reduce the total delay generated by the delay chain 304. When the charge pump circuit 324 receives a DOWN signal 318, the charge pump circuit 324 decreases as the amount of current from the loop filter 328 to decrease the control voltage and therefore increase the amount of delay generated by the delay chain 304. Thus, the loop filter 328 stabilizes the overall feed-back loop, and the rising edges of XCK(0) 204 and XCK(7) 218 are aligned, and equally spaced 14-phase clocks are obtained, as shown in FIG. 2.

The lock detector 320 detects the lock-condition between XCK(0) 204 and XCK(7) 218 and generates DLL_LOCKB signal 322 in response. In one embodiment, when the rising edges of XCK(0) 204 and XCK(7) 218 are not aligned, the DLL_LOCKB signal 322 is "1" or high. After the rising edge of XCK(O) 204 and XCK(7) 218 are aligned, DLL_LOCKB signal 322 is "0" or low.

Figure 4:
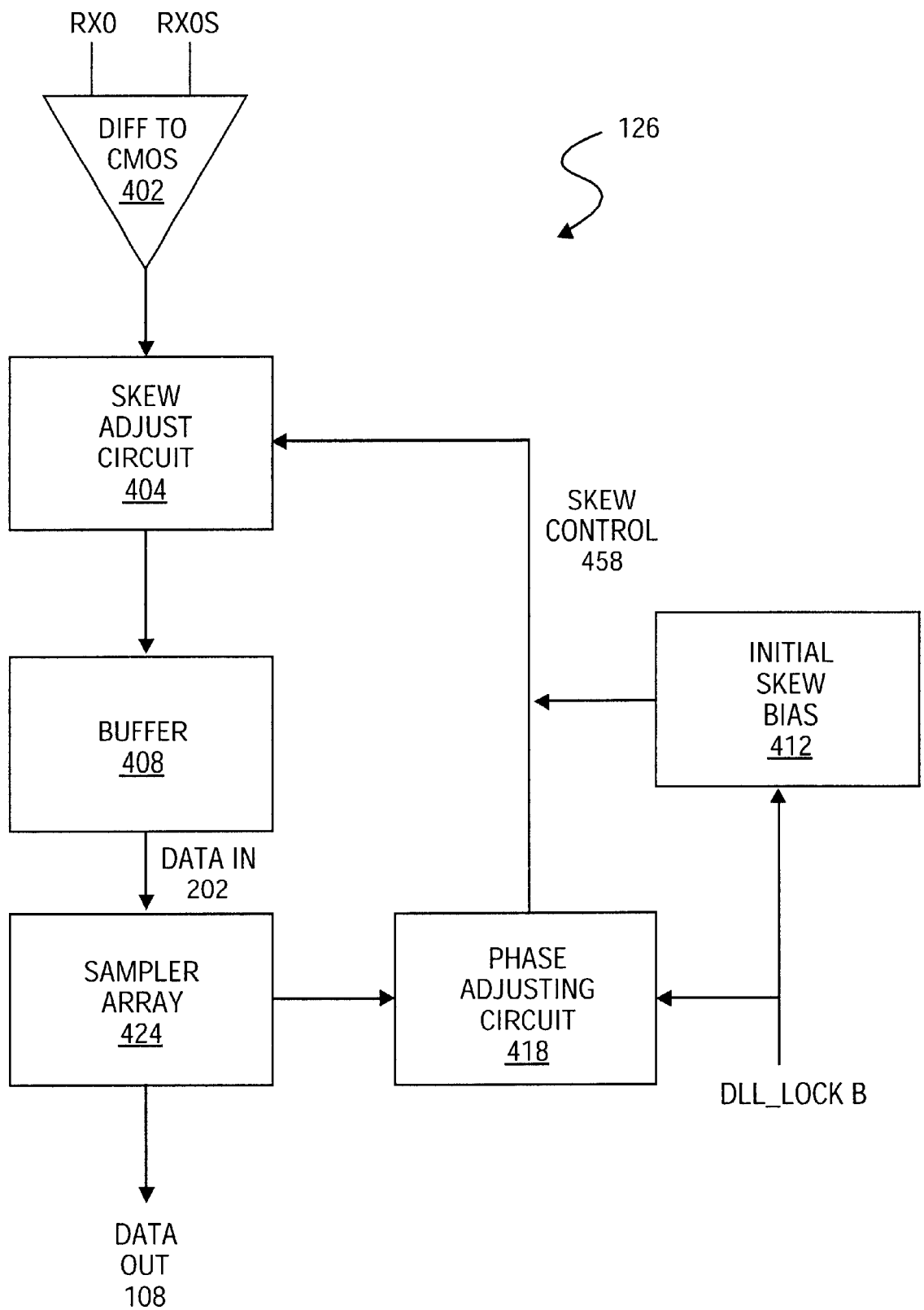
FIG. 4 is a block of the data channels.

FIG. 4 illustrates the detailed block diagram of a data recovery channel 126. The data recovery channel 126 comprises a differential-to-CMOS converter 402, a skew adjust circuit 404, a sampler array 424, a phase adjusting circuit 418 and an initial skew bias circuit 412. The differential-to-CMOS converter 402 converts LVDS serial data-in to full-swing data. The converted full-swing data is transmitted to the skew adjust circuit 404. Normally, the skew adjust circuit uses TCK and XCK from the DLL to correct the skew. At the initial state, however, the DLL takes some time to reach lock-state until which TCK and XCK are unstable. Before the DLL circuit 104 arrives at lock-state (i.e., while DLL_LOCKB is 1), the amount of delay generated by the skew adjust circuit 404 is controlled by the initial skew bias circuit 412. On the initial state, the initial skew bias circuit 412 is activated and causes the skew control voltage 458 to be 0.5×Vdd, which is the same as the replica skew bias voltage in the DLL circuit 104. As a result, on the initial state, the delay generated by the skew adjust circuit 404 in the data recovery channel 126 is equalized the delay generated by the replica skew circuit 332 in the DLL 104.

The delay from RX0 131, RX0B 133 to DataIn 202 is therefore equal to the delay from RXC 127 RXCB 129 to XCK(0) 204. Thus, the cable skew between RX0 131, RX0B 133 and RXC 127, RXCB 129 is duplicated on the timing skew between DataIn 202 and XCK(0) 204 on the initial state. After the DLL 104 arrives at lock-state (DLL_LOCKB is '0'), the initial skew bias circuit 412 is disabled and the phase adjusting circuit 418 is activated to remove the skew between the clock and data path. On this active state, the skew adjust circuit 404 is controlled by the phase adjusting circuit 418 in each data recovery channel 126 and removes the skew between data and clock path.

Figure 7:
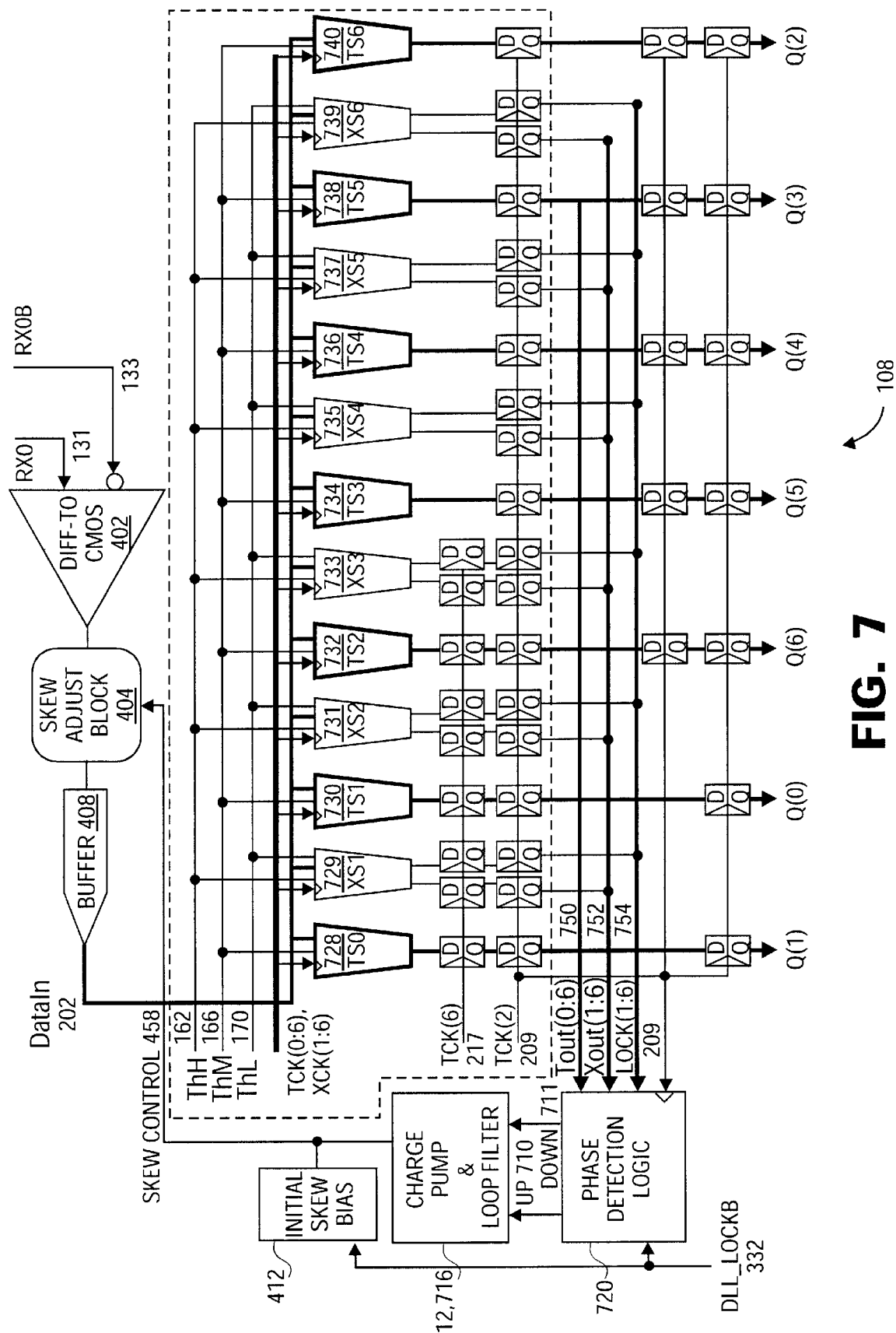
FIG. 7 is a more detailed block diagram of the phase adjusting circuit.

The sampler array 424 preferably comprises seven Tsampler (TS(0:6)) circuits 728, 730, 732, 734, 736, 738, 740 and six Xsampler (XS(0:6)) circuits 729, 731, 735, 737, 39 shown in more detail in FIG. 7. A center sampling circuit, for example, Tsampler 728, samples the center position of each serial bit on the rising edge of a center clock signal 154 and generates a sample data Tout(n) 750 which then becomes the final recovered data. A transition sampling circuit, for example, Xsampler 729, samples the transition position between the two adjacent serial bits on the rising edge of XCK(n) and the transition clock signal 158 generates a sampled data Xout(n) and a no-phase-adjust signal, LOCK (n). When the Xsampler circuit 729 samples the exact transition position, LOCK(n) 754 becomes '1' and Xout(n) 752 is invalidated. When the transition clock signal 158 samples a position which is not the exact transition position, LOCK(n) 754 becomes '0' and Xout(n) 752 is validated and used by the phase adjusting circuit 418.

Figure 5C:
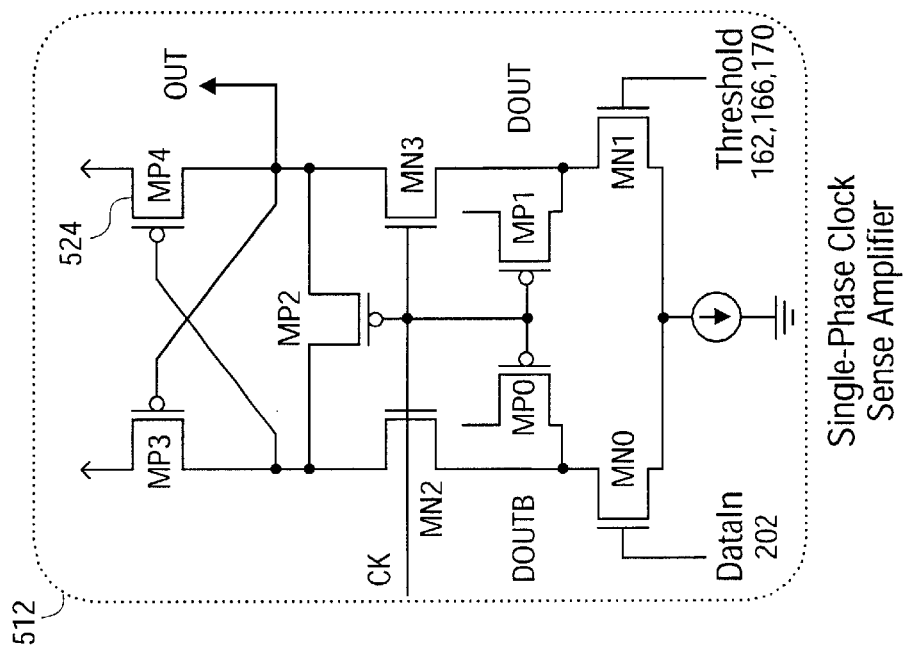
FIGS. 5a–c are more detailed block diagrams of Tsampler and Xsampler circuits.
Figure 5B:
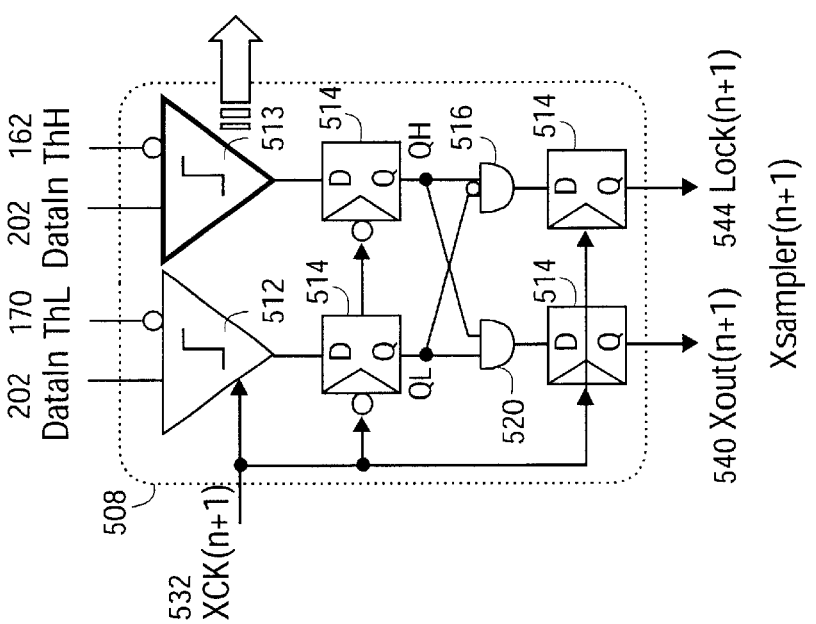
Figure 5A:
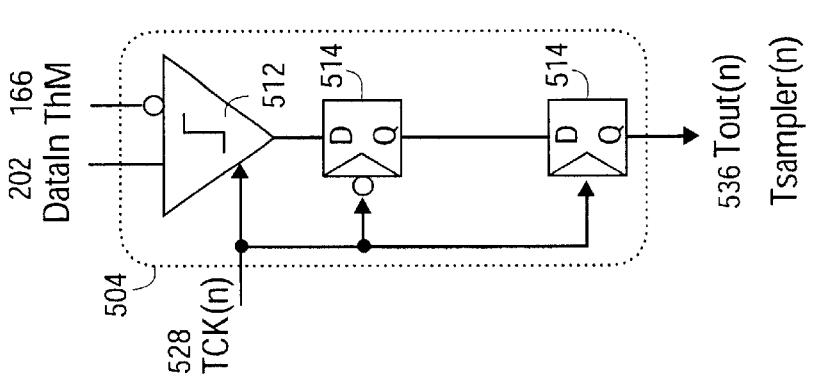

FIG. 5 illustrates the detailed circuit diagrams of the Tsampler and Xsampler circuits. FIG. 5a illustrates a Tsampler circuit 728, 730, 736, 738, 740 in more detail. The Tsampler(n) circuit comprises a single-phase clocking sense amplifier (SPCSA) 512, and two dual-state D-Flip Flop Circuits (DFF) 514. FIG. 5c illustrates an embodiment of the SPCSA 512. When the clock signal 528 is low, transistors MP0 and MP1 are turned on and act as the resistive load for the differential stage comprising transistors MN0, MN1, MP0, and MP1. Transistors MN2 and MN3 are turned off to isolate the differential stage from the positive feedback circuit composed of transistors MP3 and MP4. Transistors MP2 is turned on to equalize the OUT and OUTB signals and to prepare for signal amplification. The differential data (DOUT, DOUTB) is developed on the differential stage according to the difference between DataIn 202 and the threshold voltage which is, in this case, ThM 166. When the clock signal 528 is HIGH, MP0, MP1 and MP3 are turned off. MN2 and MN3 are turned on and the positive feedback circuit comprising MP3 and MP4 amplifies the differential signal (DOUT, DOUTB) and creates the full swing sampled data (TOUT) 536. The middle threshold voltage ThM 166 used by Tsampler(n) is 0.5 Vdd, which is the ideal logic threshold for a full swing signal.

The Xsampler(n+1) circuit for sampling transitions is preferably composed of two SPCSAs 512, 4 DFFs 514 and combinational logic. A first SPCSA 512 uses a low threshold voltage (ThL) 170 which is 0.33 Vdd. The output of the first SPCSA 512 and FlipFlop 514 is QL, a skew detecting signal. The other SPCSA circuit 513 uses a high threshold voltage (ThH) 62 which is 0.66 Vdd and generates through FlipFlop 514 an output QH, another skew detecting signal. If the XCK(n+1) signal 532 occurs close to the transition position of two adjacent serial bits (i.e., data and clock are aligned), the output of the first SPCSA 572, QL, is '1' and the output of the second SPCSA 572, QH, is '0'. The LOCK(n+1) signal 544 is '1'. If the XCK(n+1) signal is close the center position of the serial bit (i.e., data and clock are not aligned), the QL/QH outputs are 1/1 or 0/1, and the LOCK signal 544 is '0'. The threshold voltages, ThL, ThH, and ThM, are generated by the threshold bias circuit 148.

FIG. 6 illustrates the operation of Tsampler and Xsampler in greater detail. FIG. 6a shows the condition in which the data user and clock signals 204 are in exact alignment. In this condition, QH is '0' and QL is '1' because the sampled voltage level of the DataIn 202 is lower than 0.66 Vdd (the ThH threshold) and higher than 0.33 Vdd (the ThL threshold). As a result, the LOCK(n+1) signal transitions to '1' and XOUT(n+1) is invalidated. TOUT(n) and TOUT(n+1) samples the center position of each serial bit and become the recovered data. FIG. 6b shows the condition in which the data signal 202 leads the clock signal 204. In this condition the QH/QL outputs are 0/0 or 1/1 because the sample voltage level of the data is lower (or higher) than both of the levels of the ThH 170 and ThL 162 thresholds. As a result, LOCK(n+1) becomes '0' and XOUT(n+1) is validated. TOUT(n), XOUT(n+1), and TOUT(n+1) are either 100 or 011, which causes the phase adjusting circuit 418 to assert a DOWN phase recommendation signal. FIG. 6c shows the condition in which the data signal 20 lags the clock signal 204. In this condition, the QH/QL outputs are 1/1 or 0/0 because the sampled voltage level of the data is higher (or lower) than both the levels of the ThH and ThL thresholds. As a result, LOCK(n+1) signal becomes '0' and XOUT(n+1) is validated. TOUT(n), XOUT(n+1), and TOUT(n+1) are either 110 or 001, which causes the phase adjusting circuit 418 to assert an UP phase recommendation signal.

FIG. 7 illustrates a detailed block diagram of the phase adjusting circuit 418. In this embodiment, the phase adjusting circuit 418 comprises a phase detection logic circuit 720, a charge pump 716, and a loop filter 712. The phase detection logic circuit 720 is activated when DLL_LOCKB 322 becomes '0'. The phase detection logic circuit 720 receives Tout(0:6) 750, Xout(1:6) 752, and LOCK(1:6) 754 and then determines the status of the skew between the data and clock path from the signals. When the data leads clock, the phase detection circuit 720 sets the UP phase recommendation signal 710 to '0' and the DOWN phase recommendation signal 711 to '1'. When data lags clock, the phase detection circuit 720 sets the UP phase recommendation signal 710 to '1' and the DOWN phase recommendation signal 711 to '0'. When the skew between the data and clock signals is completely removed, that is, data and clock are completely aligned, the phase detection logic circuit 720 sets the UP phase recommendation signal 710 to '0' and the DOWN phase recommendation signal 711 to '0'.

The charge pump 716 discharges the loop filter 712 to decrease the skew control voltage 458 and reduce the delay of the skew adjust circuit 404 when the UP phase recommendation signal 710 is '1'. The charge pump 716 charges the loop filter 712 to increase the skew control voltage 458 and increase the delay of the skew adjust circuit 404 when the DOWN phase recommendation signal 711 is '1'. Thus, skew between RX0 131, RX0B 133 and RXC 127, RXCB 129 which is duplicated on the timing skew between DataIn 202 and XCK(0) 204 is removed. As a result, TCK(0:6) 154 continuously samples the exact center position of each serial bit and Tout(0:6) 450 becomes recovered data. The Tout(0:6) data signals 450 are synchronized by the TCK(0:6) clock signals 154 respectively. After passing the paralleling Flip-Flop 514 stage, Tout(0:6) 450 becomes the final recovered data, Q(0:6) 108, which is synchronized by TCK(2) 209.

Figures 8A, 8B:
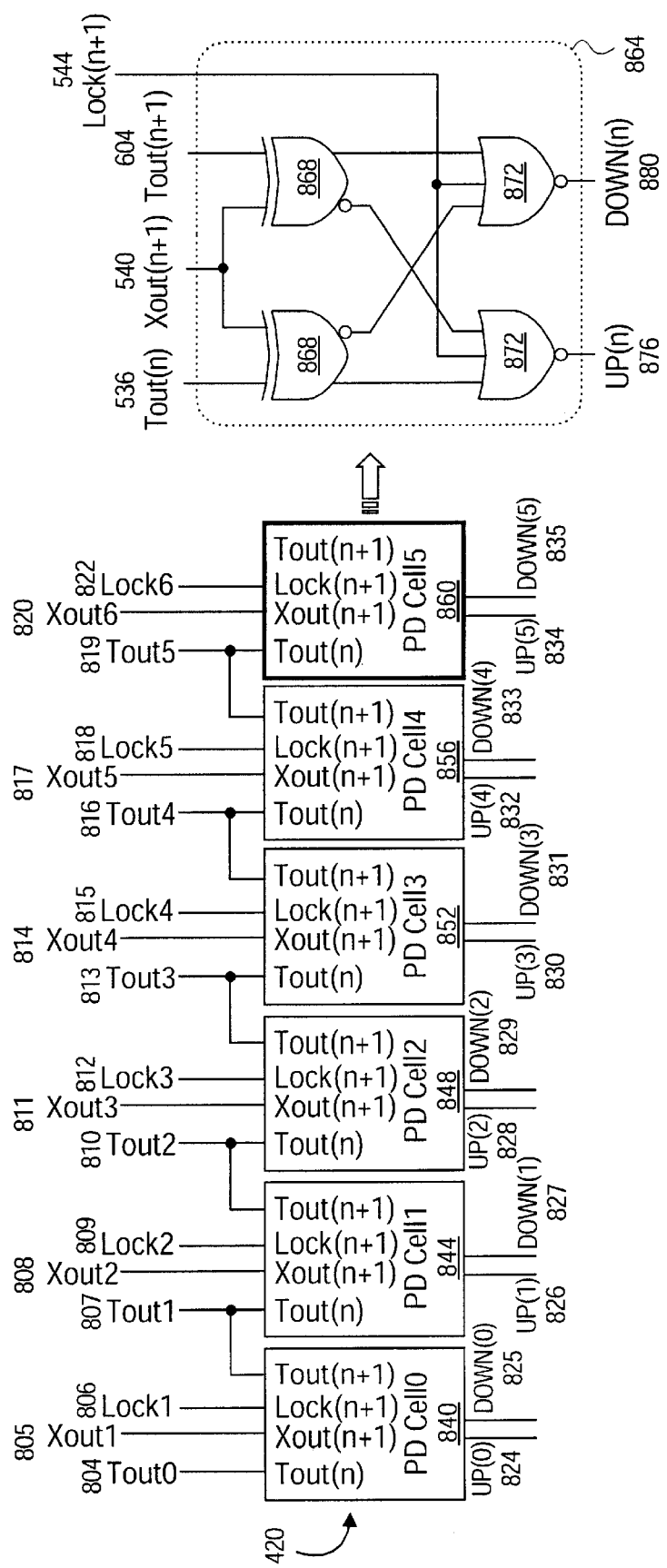
FIGS. 8a–d are detailed block diagrams of the components of the phase adjusting circuits.
Figures 8C, 8D:
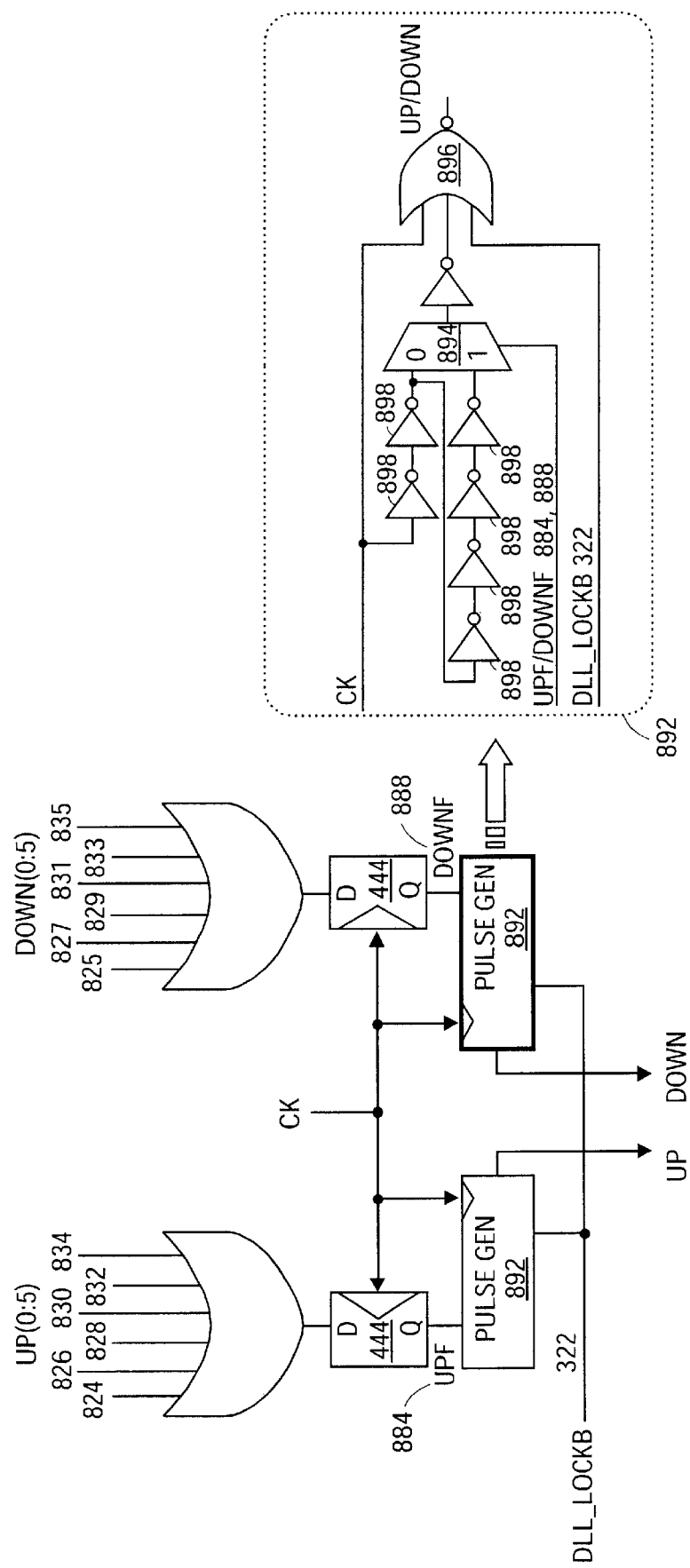

FIG. 8a is a more detailed illustration of the phase detection logic circuit 720. The phase detection logic circuit 720 preferably comprises six phase detection cells (PD Cell(0:6)) 840, 844, 848, 856, 860 and a stage for generating phase recommendation UP/DOWN pulses, as shown in FIG. 8c. As shown in FIG. 8b, PDCell(n) 864 receives the TOUT(n) 536, Xout(n+1) 540, LOCK(n+1) 544, and TOUT (n+1) 604 signals and generates an phase adjust signal UP(n) 876 and a phase adjust signal DOWN(n) 880 signals in response. As described above, when the data 202 and clock 204 signals are exactly aligned, the LOCK(n+1) signal 544 is 1, which causes the UP(n) and DOWN(n) signals 801, 803 to be 0/0 respectively. When data 202 leads clock 204, LOCK(n+1) 544 is '0' and the TOUT(n) 536, XOUT(n+1) 540, TOUT(n+1) 604 signals are 100 or 011, respectively, which causes the UP(n) and DOWN(n) signals 801, 803 to be 0/1 respectively. When data 202 lags clock 204, the LOCK(n+1) 544 is '0' and TOUT(n) 536, XOUT(n+1) 540, TOUT(n+1) 604 are 110 or 001 respectively, which causes UP(n) and DOWN(n) signals 801 to be 1/0.

The UPF 884 and DOWNF 888 signals are obtained by ORing the UP(0:5) 824, 826, 828, 830, 832 and DOWN(0:5) 825, 827, 829, 831, 833 signals together, respectively. The pulse generator 892 continuously generates pulses on every falling edge of the clock 204. When DLL_LOCKB 322 is '1' (initial state), both the UP 877 and DOWN 878 pulses are set to '0', which disables the phase adjusting circuit 418 in the data recovery channel 126. When DLL_LOCKB 322 is '0' (active state), the pulse generator 892 are activated to activate the phase adjusting circuit 418 in the data recovery channel 126. When neither the UPF nor the DOWNF signals 884, 888 are asserted, the UP/DOWN pulses 877, 878 having the same pulse widths are asserted. When the UPF signal 884 is asserted and the DOWNF 784 is not, the width of UP pulse 877 becomes larger than that of DOWN pulse 878.

Figure 9:
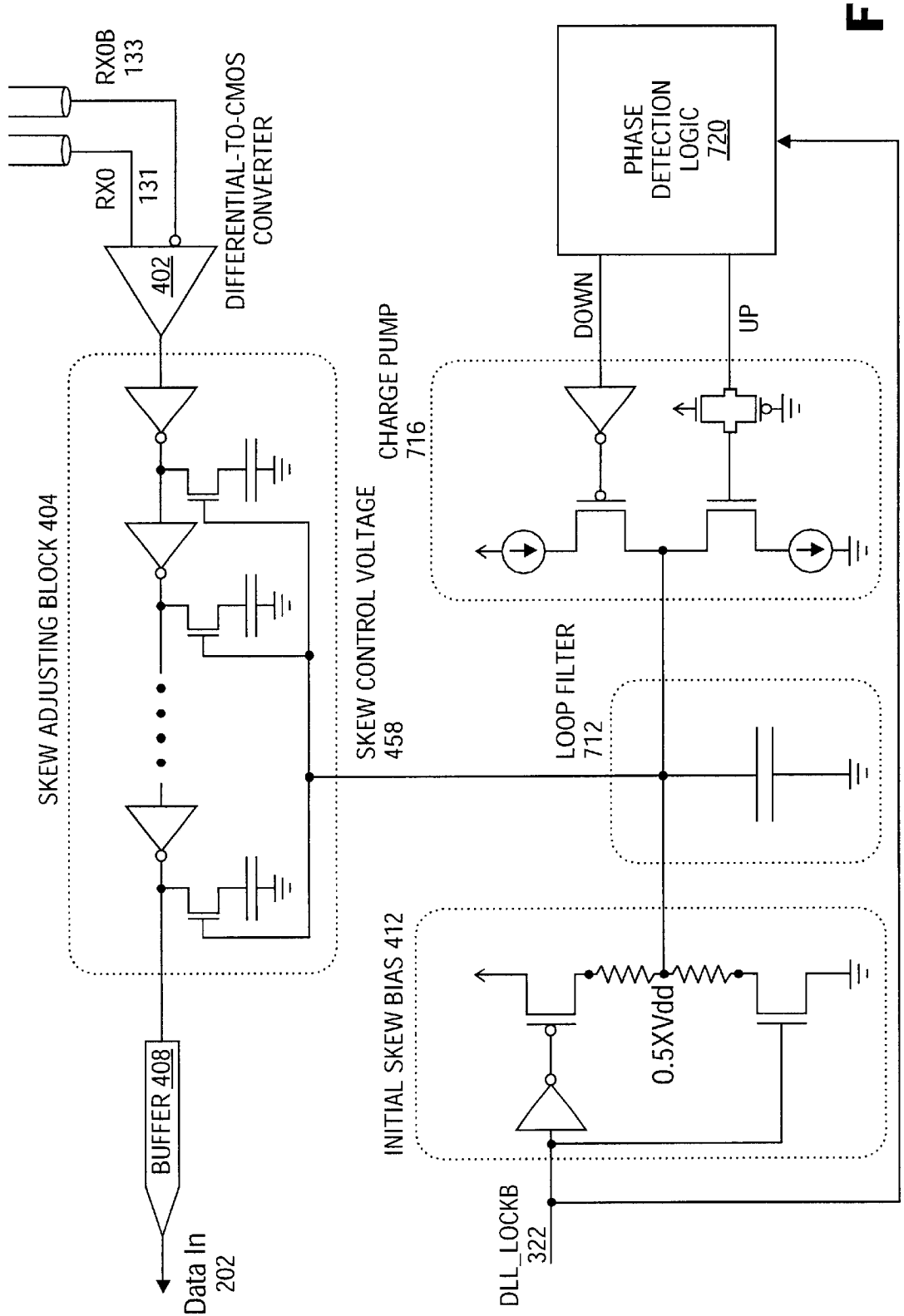
FIG. 9 is a more detailed block diagram of the skew-adjusting circuit.

FIG. 9 illustrates the skew adjust circuit 404 in each data recovery channel 126. When DLL_LOCKB 322 is '0' (initial state), the phase detection logic circuit 720 is turned off, and both of the UP/DOWN pulses 877, 878 are set to '0' as previously mentioned. As a result, the charge pump 716 goes into tri-state, the initial skew bias circuit 412 is activated, and the skew control voltage 458 is set to be 0.5 Vdd. Thus, the initial delay from RX0 131, RX0B 133 to DataIn 202 is equalized with the delay from RXC 127, RXCB 129 to XCK(0) 204. If timing skew caused by cable or board line length mismatches between RX0 131, RX0B 133 and RX 127, RXCB 129 exists, the same timing skew is duplicated between DataIn 202 and XCK(0) 204 on the initial state. When the DLL 104 acquires locking-state (DLL_LOCKB is 1=Active state), the initial skew bias circuit 412 is turned off and goes into tri-state. The phase adjusting circuit 418 is activated and UP/DOWN pulses 877, 878 are generated depending on initial timing skew between DataIn 202 and XCK(0) 204. The phase adjusting circuit 418 back-adjusts the delay of skew adjust circuit 404 and removes the initial timing skew between clock and data channel so that TCK(0:6) 154 correctly samples the exact center position of each serial bit 202 (DataIn).

While the invention has been described with reference to preferred embodiments, it is not intended to be limited to those embodiments. It will be appreciated by those of ordinary skill in the art that many modifications can be made to the structure and form of the described embodiments without departing from the spirit and scope of the invention, which is defined and limited only in the following claims. For example, the invention may be used to correct the skew between a high-speed data signal and an associated clock signal.

What is claimed is:

1. An apparatus for correcting skew between high-speed differential swing data signals and an associated clock signal, the apparatus comprising:

a delay locked loop, coupled to the clock signal, for converting the clock signal into a full-swing clock signal and generating a plurality of clock recovery signals from the full-swing clock signal; and data recovery channels, each data recovery channel coupled to a data signal and the plurality of clock recovery signals, comprising:

a converter for converting differential data signals into full-swing data signals;

a skew adjust circuit for adjusting the skew of the full-swing data signals;

a sampler array, coupled to the delay locked loop and the skew adjust circuit, for oversampling the full-swing data signals responsive to the plurality of clock signals and producing sampled data signals and lock signals; and a phase adjusting circuit, coupled to the data recovery channels and the skew adjust circuit, for generating skew control signals to transmit to the skew adjust circuit responsive to the oversampled data signals and lock signals received from the sampler array.

2. The apparatus of claim 1 wherein the sampler array further comprises:

a plurality of transition sampling circuits for sampling transitions between two adjacent serial bits of data and generating a lock signal and a sampled transition data signal responsive to the sampled transition;

a plurality of center sampling circuit for sampling a center point of each serial bit of data and generating a center sample signal responsive to the sample; and the phase adjusting circuit for generating the skew control signals responsive to the center sample signals, lock signals, and sampled transition data signals received from the sampler array.

3. The apparatus of claim 2 further comprising:

a threshold bias circuit, for generating a high threshold signal, a low threshold signal, and a middle threshold signal having a voltage equal to an ideal logic threshold of a full swing data signal;

the center sampling circuits for comparing the voltage of the sampled center point of each serial bit of data to the middle threshold to generate a current skew signal and a next skew signal, wherein the skew signal is high responsive to the voltage of the sampled point exceeding the middle threshold signal; and the transition sampling circuit for comparing the voltage of the sampled transition point to the middle transition for generating a lock signal responsive to the sampled voltage being between the high and low threshold voltages, and for generating a high signal responsive to the sampled voltage, and for generating a low signal responsive to the sampled voltage being less than the low threshold signal.

4. The apparatus of claim 2 wherein the phase adjusting circuit further comprises:

a plurality of phase detection cells, each cell coupled to one of the transition sampling circuits to receive a lock signal and a sampled transition data signal, and one of the center sampling circuits to receive a center sample signal, for generating an up-phase-adjust signal responsive to the lock signal indicating no lock, and the sample transition data signal and center sample signal indicating the data signal is lagging the clock signal, and for generating a down-phase-adjust signal responsive to the lock signal indicating no lock, and the transition data signal and center sample signal indicating the clock signal is lagging the data signal and generating a no-phase-adjust signal responsive to lock signal indicating a lock; and a phase recommendation circuit, for comparing the plurality of up-phase-adjust signals, down-phase-adjust signals, and no-phase-adjust signals transmitted by the plurality of phase detection cells, to generate a phase recommendation signal.

5. An apparatus for correcting skew between low-voltage differential swing (LVDS) data signals and an LVDS clock signal, the apparatus comprising:

a delay locked loop, coupled to the LVDS clock signal, for converting the LVDS clock signal into a full-swing clock signal and generating a plurality of clock recovery signals from the full-swing clock signal; and data recovery channels, each data recovery channel coupled to a data signal and the plurality of clock recovery signals, comprising:

an LVDS converter for converting LVDS data signals into full-swing data signals;

a skew adjust circuit for adjusting the skew of the full-swing data signals;

a sampler array, coupled to the delay locked loop and the skew adjust circuit, for oversampling the full-swing data signals responsive to the plurality of clock signals and producing sampled data signals and lock signals; and a phase adjusting circuit, coupled to the data recovery channels and the skew adjust circuit, for generating skew control signals to transmit to the skew adjust circuit responsive to the oversampled data signals and lock signals received from the sampler array.

6. The apparatus of claim 5 wherein the sampler array further comprises:

a plurality of transition sampling circuits for sampling transitions between two adjacent serial bits of data and generating a lock signal and a sampled transition data signal responsive to the sampled transition; and a plurality of center sampling circuit for sampling a center point of each serial bit of data and generating a center sample signal responsive to the sample; and the phase adjusting circuit for generating the skew control signals responsive to the center sample signals, lock signals, and sampled transition data signals received from the sampler array.

7. The apparatus of claim 6 further comprising:

a threshold bias circuit for generating a high threshold signal, a low threshold signal, and a middle threshold signal having a voltage equal to an ideal logic threshold of a full swing data signal;

the center sampling circuits for comparing the voltage of the sampled center point of each serial bit of data to the middle threshold to generate a current skew signal and a next skew signal, wherein the skew signal is high responsive to the voltage of the sampled point exceeding the middle threshold signal; and the transition sampling circuit for comparing the voltage of the sampled transition point to the middle transition for generating a lock signal responsive to the sampled voltage being between the high and low threshold voltages, and for generating a high signal responsive to the sampled voltage, and for generating a low signal responsive to the sampled voltage being less than the low threshold signal.

8. The apparatus of claim 6 wherein the phase adjusting circuit further comprises:

a plurality of phase detection cells, each cell coupled to one of the transition sampling circuits to receive a lock signal and a sampled transition data signal, and one of the center sampling circuits to receive a center sample signal, for generating an up-phase-adjust signal responsive to the lock signal indicating no lock, and the sample transition data signal and center sample signal indicating the data signal is lagging the clock signal, and for generating a downphase-adjust signal responsive to the lock signal indicating no lock, and the transition data signal and center sample signal indicating the clock signal is lagging the data signal, and generating a no-phase-adjust signal responsive to lock signal indicating a lock; and a phase recommendation circuit for comparing the plurality of up-phase-adjust signals, down-phase-adjust signals, and no-phase-adjust signals transmitted by the plurality of phase detection cells, to generate a phase recommendation signal.

9. The apparatus of claim 5 further comprising:

a plurality of delay cells, coupled together serially, each cell for delaying a clock signal for half of a data cycle, for receiving the LVDS clock signal and generating a set of center clock signals and a set of transition clock signals.

10. The apparatus of claim 9, the plurality of delay cells further comprising:

a first buffer, coupled to the LVDS clock signal, for generating a first transition clock signal;

a first delay device coupled to the LVDS clock signal, for delaying the LVDS clock signal for a half of a clock cycle; a second buffer, coupled to the first delay device, for receiving the delayed clock signal, and generating a first center clock signal; and a second delay device, coupled to the first delay device, for delaying the LVDS clock signal for a half of a clock cycle;

a third buffer, coupled to the second delay cell, for generating a second transition clock signal; and wherein delay devices and buffers are repeatedly coupled together to generate a plurality of transition and center clock signals.

11. The apparatus of claim 9, wherein the amount of delay provided by a delay cell is adjustable, further comprising:

a phase detector, coupled to a first center clock signal and a last center clock signal, for comparing rising edges of the clock signals and generating a shift down signal responsive to the rising edge of the last center clock signal leading the rising edge of the first center clock signal, generating a shift up signal responsive to the rising edge of the last center clock signal lagging the rising edge of the first center clock signal; and a charge pump circuit, having an input coupled to the phase detector and an output coupled to the delay cells, for adjusting the delay of the delay cells responsive to receiving an shift up or shift down signal.

12. The apparatus of claim 9, further comprising:

a lock detector, coupled to a first center clock signal and a last center clock signal, for generating a lock signal responsive to detecting that a rising edge of the first center clock signal is synchronous with a rising edge of a last center clock signal, and for generating a no-lock signal otherwise.

13. The apparatus of claim 12, wherein the delay locked loop further comprises:

a replica skew circuit, having an input coupled to the LVDS clock signal and an output coupled to the plurality of delay cells, for adding a fixed amount of delay to the LVDS clock signal; and the data recovery channels further comprising:

an initial bias circuit, coupled to the skew adjust circuit and the lock detecting circuit, for causing the skew adjust circuit to add a fixed amount of delay to the input data signal responsive to receiving a no-lock signal from the lock detecting circuit, wherein the fixed amount of delay added by the skew adjust circuit is equal to the fixed amount of delay added by the replica skew circuit.

14. An apparatus for correcting skew between a high-speed data signal and an associated clock signal, the apparatus comprising:

a delay locked loop, coupled to the clock signal, for generating a plurality of clock recovery signals from the clock signal; and a data recovery channel, coupled to the data signal and the plurality of clock recovery signals, comprising:

a skew adjust circuit, for adjusting the skew of the full-swing data signals;

a sampler array, coupled to the delay locked loop and the skew adjust circuit, for oversampling the data signal responsive to the plurality of clock signals and producing sampled data signals and lock signals; and a phase adjusting circuit, coupled to the data recovery channels and the skew adjust circuit, for generating skew control signals to transmit to the skew adjust circuit responsive to the oversampled data signal and lock signal received from the sampler array.

15. The apparatus of claim 14 wherein the sampler array further comprises:

a plurality of transition sampling circuits, for sampling transitions between two adjacent serial bits of data and generating a lock signal and a sampled transition data signal responsive to the sampled transition;

a center sampling circuit, for sampling a center point of each serial bit of data and generating a center sample signal responsive to the sample; and the phase adjusting circuit generating skew control signals responsive to the center sample signal, lock signal, and sampled transition data signal received from the sampler array.

16. The apparatus of claim 15 wherein the phase adjusting circuit further comprises:

a phase detection circuit, coupled to one of the transition sampling circuits to receive a lock signal and a sampled transition data signal, and the center sampling circuit to receive a center sample signal, for generating an up-phase-adjust signal responsive to the lock signal indicating no lock, and the sample transition data signal and center sample signal indicating the data signal is lagging the clock signal, and for generating a down-phase-adjust signal responsive to the lock signal indicating no lock, and the transition data signal and center sample signal indicating the clock signal is lagging the data signal and generating a no-phase-adjust signal responsive to lock signal indicating a lock; and a phase recommendation circuit, for comparing the up-phase-adjust signals, down-phase-adjust signals, and no-phase-adjust signals transmitted by the plurality of phase detection cells, to generate a phase recommendation signal.

17. A method for correcting skew between high-speed differential swing data signals and an associated clock signal comprising the steps of:

converting the clock signal into a full-swing clock signal;

generating a plurality of clock recovery signals from the full-swing clock signal;

converting the differential data signals into full-swing data signals;

oversampling the full-swing data signals responsive to the plurality of clock signals to produce oversampled data signals and lock signals;

generating skew control signals responsive to the oversampled data signals and lock signals; and adjusting the skew of the data signals responsive to the skew control signals.

18. The method of claim 17 wherein the step of oversampling further comprises:

sampling transitions between two adjacent serial bits of data;

generating a lock signal and a sampled transition data signal responsive to the sampled transitions;

sampling a center point of each serial bit of data;

generating a center sample signal responsive to the sample; and the step of generating skew control signals further comprising generating skew control signals responsive to the center sample signals, lock signals, and sampled transition data signals.

19. The method of claim 17 wherein the step of oversampling further comprises:

generating a high threshold signal, a low threshold signal, and a middle threshold signal having a voltage equal to an ideal logic threshold of a full swing data signal;

comparing the voltage of the sampled center point of each serial bit of data to the middle threshold to generate a current skew signal and a next skew signal, wherein the skew signal is high responsive to the voltage of the sampled point exceeding the middle threshold signal; and comparing the voltage of the sampled transition point to the middle transition for generating a lock signal responsive to the sampled voltage being equal to the voltage of the middle threshold signal, and for generating a high signal responsive to the sampled voltage exceeding the high threshold signal, and for generating a low signal responsive to the sampled voltage being less than the low threshold signal.

20. The method of claim 17 wherein the step of generating skew control signals further comprises:

generating an up-phase-adjust signal responsive to the lock signal indicating no lock and the sample transition data signal and center sample signal indicating the data signal is lagging the clock signal;

generating a down-phase-adjust signal responsive to the lock signal indicating no lock and the transition data signal and center sample signal indicating the clock signal is lagging the data signal;

generating a no-phase-adjust signal responsive to the lock signal indicating a lock; and comparing the plurality of up-phase-adjust signals, down-phase-adjust signals, and no-phase-adjust signals to generate a skew control signal.

21. A method for correcting skew between low-voltage differential swing (LVDS) data signals and an LVDS clock signal comprising the steps of:

converting the LVDS clock signal into a full-swing clock signal;

generating a plurality of clock recovery signals from the full-swing clock signal;

converting LVDS data signals into full-swing data signals;

oversampling the full-swing data signals responsive to the plurality of clock signals to produce oversampled data signals and lock signals;

generating skew control signals responsive to the oversampled data signals and lock signals; and adjusting the skew of the data signals responsive to the skew control signals.

22. The method of claim 21 wherein the step of oversampling further comprises:

sampling transitions between two adjacent serial bits of data;

generating a lock signal and a sampled transition data signal responsive to the sampled transitions;

sampling a center point of each serial bit of data;

generating a center sample signal responsive to the sample; and the step of generating skew control signals further comprising generating skew control signals responsive to the center sample signals, lock signals, and sampled transition data signals.

23. The method of claim 21 wherein the step of oversampling further comprises:

generating a high threshold signal, a low threshold signal, a middle threshold signal having a voltage equal to an ideal logic threshold of a full swing data signal;

comparing the voltage of the sampled center point of each serial bit of data to the high threshold to generate a current skew signal and to the low threshold to generate a next skew signal, wherein the skew signal is high responsive to the voltage of the sampled point exceeding the middle threshold signal and low responsive to the voltage of the sampled point being less than the middle threshold signal; and comparing the voltage of the sampled transition point to the middle transition for generating a lock signal responsive to the sampled voltage being equal to the voltage of the middle threshold signal, and for generating a high signal responsive to the sampled voltage exceeding the high threshold signal, and for generating a low signal responsive to the sampled voltage being less than the low threshold signal.

24. The method of claim 21 wherein the step of generating skew control signals further comprises:

generating an up-phase-adjust signal responsive to the lock signal indicating no lock and the sample transition data signal and center sample signal indicating the data signal is lagging the clock signal;

generating a down-phase-adjust signal responsive to the lock signal indicating no lock and the transition data signal and center sample signal indicating the clock signal is lagging the data signal;

generating a no-phase-adjust signal responsive to the lock signal indicating a lock; and comparing the plurality of up-phase-adjust signals, down-phase-adjust signals, and no-phase-adjust signals to generate a skew control signal.

25. A method for correcting skew between a high-speed data signal and an associated clock signal comprising the steps of:

generating a plurality of clock recovery signals from the clock signal;

oversampling the data signal responsive to the plurality of clock signals to produce an oversampled data signal and a lock signal;

generating the skew control signal responsive to the oversampled data signal and the lock signal; and adjusting the skew of the data signal responsive to the skew control signal.

26. The method of claim 25 wherein the step of oversampling further comprises:

sampling transitions between two adjacent serial bits of data;

generating a lock signal and a sampled transition data signal responsive to the sampled transitions;

sampling a center point of each serial bit of data;

generating a center sample signal responsive to the sample; and the step of generating a skew control signal further comprising generating a skew control signal responsive to the center sample signal, lock signal, and sampled transition data signal.

27. The method of claim 26 wherein the step of generating skew control signals further comprises:

generating an up-phase-adjust signal responsive to the lock signal indicating no lock and the sample transition data signal and center sample signal indicating the data signal is lagging the clock signal;

generating a down-phase-shift signal responsive to the lock signal indicating no lock and the transition data signal and center sample signal indicating the clock signal is lagging the data signal;

generating a no-phase-adjust signal responsive to the lock signal indicating a lock; and comparing the up-phase-adjust signal, down-phase-adjust signal, and no-phase-adjust signal to generate a skew control signal.

* * * * *